US012680871B2

(12) United States Patent
Cheng et al.

(10) Patent No.: US 12,680,871 B2
(45) Date of Patent: Jul. 14, 2026

(54) METHODS AND DEVICES OF 425NM WAVELENGTH REFERENCE CONSTRUCTION BASED ON FLUORESCENCE-INDUCED EFFECT

(71) Applicants: TONGJI UNIVERSITY, Shanghai (CN); NATIONAL INSTITUTE OF METROLOGY, CHINA, Beijing (CN)

(72) Inventors: Xinbin Cheng, Shanghai (CN); Xiao Deng, Shanghai (CN); Cong Yin, Beijing (CN); Jianbo Wang, Beijing (CN); Tongbao Li, Shanghai (CN); Tong Zhou, Shanghai (CN); Dongbai Xue, Shanghai (CN); Guangxu Xiao, Shanghai (CN); Junyu Shen, Shanghai (CN); Zhijun Yin, Shanghai (CN)

(73) Assignees: TONGJI UNIVERSITY, Shanghai (CN); NATIONAL INSTITUTE OF METROLOGY, CHINA, Beijing (CN)

( * ) Notice: Subject to any disclaimer, the term of this patent is extended or adjusted under 35 U.S.C. 154(b) by 0 days.

(21) Appl. No.: 19/294,233

(22) Filed: Aug. 7, 2025

(65) Prior Publication Data

US 2026/0056053 A1     Feb. 26, 2026

(30) Foreign Application Priority Data

Aug. 23, 2024     (CN) .......................... 202411168206.5

(51) Int. Cl.
*G01J 3/28* (2006.01)
*G01R 23/14* (2006.01)
(Continued)

(52) U.S. Cl.
CPC .............. *G01J 3/28* (2013.01); *G01R 23/145* (2013.01); *G02F 1/3503* (2021.01);
(Continued)

(58) Field of Classification Search
CPC ....... G01J 2003/2866; G01J 2003/2873; G01J 3/28; G01R 23/145; G02F 1/3503;
(Continued)

(56) References Cited

U.S. PATENT DOCUMENTS

2006/0251424 A1     11/2006   Nicholson et al.
2013/0003766 A1      1/2013   Savchenkov et al.
2019/0212629 A1      7/2019   Wu et al.

FOREIGN PATENT DOCUMENTS

CN          101303412 A      11/2008
CN          102494770 A       6/2012
(Continued)

OTHER PUBLICATIONS

The Second Office Action in Chinese Application No. 202411168206.5 mailed on Feb. 17, 2025, 19 pages.

(Continued)

*Primary Examiner* — Peter B Kim
(74) *Attorney, Agent, or Firm* — PORUS IP LLC

(57) ABSTRACT

The present disclosure relates to a method and a device of a 425 nm wavelength reference construction based on fluorescence-induced effect. The method comprises: a continuously tunable laser, an atomic furnace, a chromium atomic beam, an optical frequency comb, a frequency doubling optical path, a bias-preserving fiber beam splitter, a bias-preserving fiber beam combiner, a beat-frequency detection optical path, an optoelectronic receiver, and a frequency counter atomic furnace.

8 Claims, 3 Drawing Sheets

100

(51) Int. Cl.
| | | |
|---|---|---|
| *G02F 1/35* | (2006.01) | |
| *G02F 1/355* | (2006.01) | |
| *G02F 1/37* | (2006.01) | |

(52) U.S. Cl.
CPC .......... *G02F 1/3551* (2013.01); *G02F 1/3558* (2013.01); *G02F 1/37* (2013.01); *G01J 2003/2866* (2013.01); *G01J 2003/2873* (2013.01); *G02F 2202/20* (2013.01)

(58) Field of Classification Search
CPC ........ G02F 1/3551; G02F 1/3558; G02F 1/37; G02F 2202/20
See application file for complete search history.

(56) References Cited

FOREIGN PATENT DOCUMENTS

| CN | 102589856 A | 7/2012 | |
|---|---|---|---|
| CN | 105514790 A | 4/2016 | |
| CN | 111609999 A | 9/2020 | |
| CN | 114690298 A | 7/2022 | |
| CN | 115021061 A | 9/2022 | |
| CN | 115753021 A | 3/2023 | |
| CN | 115773816 A | 3/2023 | |
| CN | 116255910 A | 6/2023 | |
| CN | 117275790 A | 12/2023 | |
| CN | 117629426 A | 3/2024 | |
| CN | 117872321 A | 4/2024 | |
| WO | 0025398 A1 | 5/2000 | |
| WO | WO-2017004656 A1 * | 1/2017 | ............ H01S 3/067 |

OTHER PUBLICATIONS

Decision to Grant a Patent in Chinese Application No. 202411168206.5 mailed on Apr. 24, 2025, 6 pages.
First Office Action in Chinese Application No. 202411168206.5 mailed on Jan. 8, 2025, 12 pages.
Jiang, Tao et al., Overview of Extraction Techniques for Scattering-Type Scanning Near-Field Optical Signal (Invited), Chinese Laser, 2024, 17 pages.
Meng, Fei et al., Study of the Femtosecond Fiber Comb and Absolute Optical Frequency Measurement, Acta Physical Sinica, 2011, 7 pages.
Liu, Huan et al., Er-Fiber Femtosecond Optical Frequency Comb Covering Visible Light, Acta Physica Sinica, 2015, 7 pages.

* cited by examiner

200 constructing a frequency measurement system of a laser and an optical frequency comb based on a technique of heterodyne beat frequency detection — S1 setting a temperature of an atomic furnace to a state of leakage generation of the chromium atomic beam, initially adjusting a laser wavelength near a theoretical value of a transition ($^7S_3$-$^7P_4$) frequency of the chromium atoms, and a set of opposite-direction propagating lasers interacting with the chromium atomic beam and symmetrically sensitizing two fluorescent spots on both sides of a central axis of the chromium atomic beam — S2 finely adjusting a laser wavelength so that the two fluorescent spots symmetrically sensitized on both sides of the central axis of the chromium atomic beam, at which time a laser frequency is equal to the transition ($^7S_3$-$^7P_4$) frequency of the chromium atoms, and performing a measurement of the transition ($^7S_3$-$^7P_4$) frequency of the chromium atoms — S3

FIG. 2

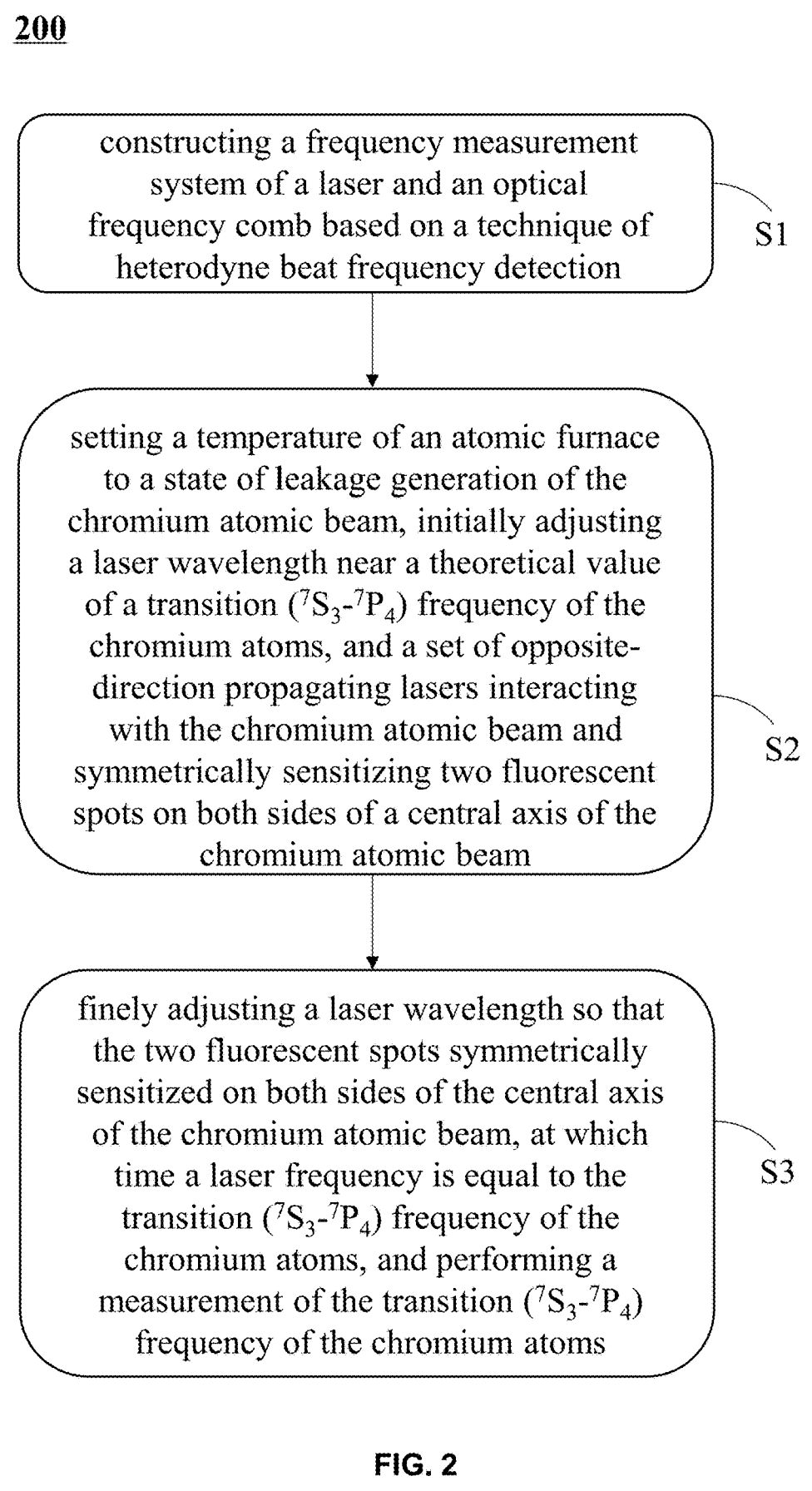

METHODS AND DEVICES OF 425NM WAVELENGTH REFERENCE CONSTRUCTION BASED ON FLUORESCENCE-INDUCED EFFECT

CROSS-REFERENCE TO RELATED APPLICATIONS

This application claims priority to a Chinese application filed on Aug. 23, 2024, Application No. 202411168206.5, entitled "a method and a device of a 425 nm wavelength reference construction based on fluorescence-induced effect", the entire contents of which are incorporated herein by reference.

TECHNICAL FIELD

The present disclosure relates to the field of transition frequency measurement, and in particular to a method and a device of a 425 nm wavelength reference construction based on fluorescence-induced effect.

BACKGROUND

In the field of advanced manufacturing, a level of ultra-precision measurement determines the stability and accuracy of manufacturing. Traceability is a fundamental issue in ultra-precision measurement, and the absence of traceability chains or the accumulation of errors in the transfer of length quantities may lead to a reduction in the measurement accuracy, consistency, and comparability of nano measurement instruments, thus limiting the development of nano-manufacturing. The key to solving the above problem is to ensure the uniformity and accuracy of nanoscale geometric measurement testing, i.e., to require the nanometer measurement to be linked through a continuous and unbroken length traceability chain to the "meter" definition. The wavelength reference, as the standard for the transmission of optical quantities in the International System of Units (SI), directly reproduces the definition of the "meter" and ensures consistency in wavelength measurements between different countries and institutions. The wavelength reference is the source of geometric traceability, allowing measurements at different locations to be compared and converted to each other, thus enabling standardization on a global scale.

The development of nano-metrology standards is a key link in realizing the transmission of wavelength reference quantitative values and ensuring the uniformity and accuracy of the nanoscale geometric measurement testing. Based on the transition ($^7S_3$-$^7P_4$) frequency of chromium atoms, a variety of self-traceable grating standards such as 1D212.8 nm, 2D212.8 nm, and 1D106.4 nm may be prepared by atomic lithography and soft X-ray interference technology. Taking the one-dimensional chromium atoms lithography grating as an example, it has been verified that the accuracy and consistency of the one-dimensional chromium atoms lithography grating with a period of 212.8 nm is on the order of 0.001 nm. In the field of application, performing the self-traceable grating on scanning probe microscope, scanning electron microscope, and other high-precision measuring instruments calibration research can shorten the nanometer length measurement traceability chain of a variety of precision instruments and processing technology processes, and achieve the flat transmission of quantity values. At the same time, there is a gap in the existing wavelength reference in the blue-violet light wavelength band of 400 nm-435 nm.

Based on the above status, in order to fill the gap regarding the 400 nm-435 nm blue-violet light wavelength band and improve the measurement accuracy of the transition ($^7S_3$-$^7P_4$) frequency of the chromium atoms, the present disclosure provides a method and a device of a 425 nm wavelength reference construction based on the fluorescence-induced effect.

SUMMARY

In order to solve the above problems, with the goal of filling the wavelength reference gap in the blue-violet wavelength band and realizing on-line real-time measurement of the transition ($^7S_3$-$^7P_4$) frequency of the chromium atoms, the present disclosure provides a method and a device of a 425 nm wavelength reference construction based on the fluorescence-induced effect.

One of the embodiments of the present disclosure provides a method and a device of a 425 nm wavelength reference construction based on fluorescence-induced effect. The device comprises a continuously tunable laser, an atomic furnace, a chromium atomic beam, an optical frequency comb, a frequency doubling optical path, a bias-preserving fiber beam splitter, a bias-preserving fiber beam combiner, a beat-frequency detection optical path, an optoelectronic receiver, and a frequency counter; wherein one side of an output end of the continuously tunable laser is provided with a first half-wave plate, a first coupler, and the bias-preserving fiber beam splitter arranged in order; the output end of the continuously tunable laser is connected to an input end of the bias-preserving fiber beam splitter; an output end of the optical frequency comb is connected to the frequency doubling optical path; the frequency doubling optical path and a first output end of the bias-preserving fiber beam splitter are connected to an input end of the bias-preserving fiber beam combiner, respectively; the chromium atomic beam is emitted through the atomic furnace and interacts with a second output end of the bias-preserving fiber beam splitter; an output end of the bias-preserving fiber beam combiner is connected to an input end of the beat-frequency detection optical path; an output end of the beat-frequency detection optical path is connected to an input end of the frequency counter through the optoelectronic receiver; the beat-frequency detection optical path includes a second collimator, a second reflector, a third half-wave plate, a polarized beam splitter cube, a third reflector, and a diffraction grating; wherein the second reflector and the third reflector are placed in parallel; the output end of the bias-preserving fiber beam combiner is connected to an input end of the optoelectronic receiver after passing the second collimator, the second reflector, the third half-wave plate, the polarized beam splitter cube, the third reflector, and the diffraction grating in sequence; the 425 nm wavelength reference construction is realized based on the device by a method for constructing a 425 nm wavelength reference based on the sensible fluorescence effect, the method comprising: S1, constructing a frequency measurement system of a laser and the optical frequency comb based on a technique of heterodyne beat frequency detection; S2, setting a temperature of the atomic furnace to a state of drain generation of the chromium atomic beam, initially adjusting a laser wavelength near a theoretical value of a transition ($^7S_3$-$^7P_4$) frequency of the chromium atoms, and a set of opposite-direction propagating lasers interacting with the chromium atomic beam and symmetrically sensitizing two fluorescent spots on both sides of a central axis of the chromium atomic beam; and S3, finely adjusting the laser wavelength so that the two fluorescent spots symmetrically sensitized on both sides of the central axis of the chromium atomic beam, at which time a laser frequency is equal to the transition ($^7S_3$-$^7P_4$) frequency of the chromium atoms, and performing a measurement of the transition ($^7S_3$-$^7P_4$) frequency of the chromium atoms.

In some embodiments, the frequency doubling optical path includes a filter, a second half-wave plate, a first convex lens, a frequency doubling crystal PPLN, a second convex lens, and a second coupler; an output end of the optical frequency comb is connected to an input end of the filter; an output end of the filter is connected to an input end of the second half-wave plate; an output end of the second half-wave plate is connected to an input end of the frequency doubling crystal PPLN; a first convex lens and a second convex lens are provided at each end of the frequency doubling crystal PPLN, respectively, the first convex lens and the second convex lens are configured to focus a beam within the frequency doubling crystal PPLN.

In some embodiments, the atomic furnace heats chromium powder to a sublimated state under a vacuum and inducing the chromium atomic beam by a drain means; the second output end of the bias-preserving fiber beam splitter forms the set of opposite-direction propagating lasers through a first collimator via a first reflector, the lasers interact with collimated chromium atomic beam, sensing the two fluorescent spots, and using a coincidence of the two fluorescent spots as a basis for determining that the laser frequency is equal to the transition ($^7S_3$-$^7P_4$) frequency of the chromium (Cr) atoms.

In some embodiments, an output wavelength band of the continuously tunable laser covers 425.5±1.0 nm, and a frequency tuning module is provided at an input end of the continuously tunable laser; a reference source of the optical frequency comb is a high-stability time-frequency signal, and an output wavelength band of the optical frequency comb covers 851±2 nm, and an output wavelength band covers 425.5±1.0 nm after passing through the frequency doubling crystal PPLN of the frequency doubling optical path.

In some embodiments, an effusion temperature of the chromium atomic beam emitted from the atomic furnace is in a range of 1500-1750 degrees Celsius.

In some embodiments, the atomic furnace achieves a collimation of the chromium atomic beam by a slit or a transverse laser light field.

In some embodiments, a direction of propagation of the chromium atomic beam is perpendicular to a direction of propagation of the set of opposite-direction propagating lasers formed at the second output end of the bias-preserving fiber beam splitter through the first reflector.

In some embodiments, a low-pass filter is provided between the optoelectronic receiver and the frequency counter.

To sum up, a method and a device of a 425 nm wavelength reference construction based on fluorescence-induced effect provided by the present disclosure, compared with the traditional transition frequency measurement technology, the method and the device can precisely measure the transition ($^7S_3$-$^7P_4$) frequency of chromium atoms by applying principles such as Doppler cooling as corresponding suppression methods for thermal effects, and while preparing atoms lithography gratings, can effectively evaluate the stability of the laser.

BRIEF DESCRIPTION OF THE DRAWINGS

The present disclosure will be further illustrated by way of exemplary embodiments, which will be described in detail by means of the accompanying drawings. These embodiments are not limiting, and in these embodiments, the same numbering denotes the same structure, wherein:

FIG. 2 is an exemplary flowchart of a method of a 425 nm wavelength reference construction based on fluorescence-induced effect according to some embodiments of the present disclosure.

DESCRIPTION OF THE DRAWINGS LABELING

Figure 1:
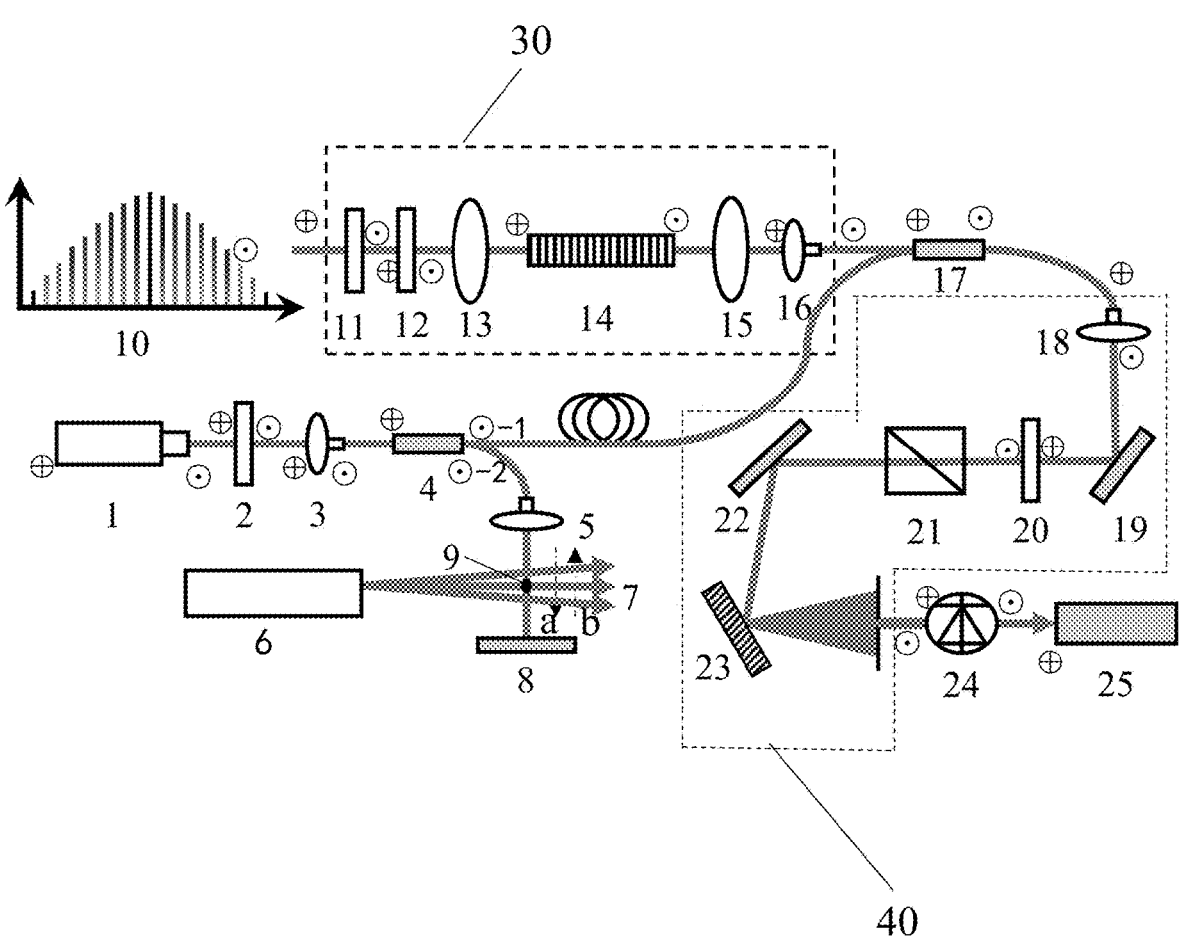
FIG. 1 is a schematic diagram of a precision measurement of a transition ($^7S_3$-$^7P_4$) frequency of chromium atoms using an optical frequency comb of a device of a 425 nm wavelength reference construction based on fluorescence-induced effect according to some embodiments of the present disclosure.

100, a device of a 425 nm wavelength reference construction based on fluorescence-induced effect; 1, a continuously tunable laser; 2, a first half-wave plate; 3, a first coupler; 4, a bias-preserving fiber beam splitter; 5, a first collimator; 6, an atomic furnace; 7, a chromium atomic beam; 8, a first reflector; 9, fluorescent spot; 10, an optical frequency comb; 11, a filter; 12, a second half-wave plate; 13, a first convex lens; 14, a frequency doubling crystal PPLN; 15, a second convex lens; 16, a second coupler; 17, a bias-preserving fiber beam combiner; 18, a second collimator; 19, a second reflector; 20, a third half-wave plate; 21, a polarized beam splitter cube; 22, a third reflector; 23, a diffraction grating; 24, an optoelectronic receiver; 25, a frequency counter; 30, a frequency doubling optical path; 40, a beat-frequency detection optical path.

DETAILED DESCRIPTION

To more clearly illustrate the technical solutions of the embodiments of the present disclosure, the accompanying drawings required to be used in the description of the embodiments are briefly described below. Obviously, the accompanying drawings in the following description are only some examples or embodiments of the present disclosure, and a person of ordinary skill in the art can apply the present disclosure to other similar scenarios in accordance with these drawings without creative labor. Unless obviously obtained from the context or the context illustrates otherwise, the same numeral in the drawings refers to the same structure or operation.

It should be understood that the terms "system," "device," "unit," and/or "module" as used herein is a way to distinguish between different components, elements, parts, sections, or assemblies at different levels. However, the words may be replaced by other expressions if other words accomplish the same purpose.

As shown in the present disclosure and the claims, unless the context suggests an exception, the words "a," "an," "one," "one kind," and/or "the" do not refer specifically to the singular, but may also include the plural. Generally, the terms "including" and "comprising" suggest only the inclusion of clearly identified steps and elements that do not constitute an exclusive list, and the method or apparatus may also include other steps or elements.

FIG. 1 is a schematic diagram of a precision measurement of a transition ($^7S_3$-$^7P_4$) frequency of chromium atoms using an optical frequency comb of a device of a 425 nm wavelength reference construction based on fluorescence-induced effect according to some embodiments of the present disclosure.

As shown in FIG. 1, the device 100 of the 425 nm wavelength reference construction based on fluorescence-induced effect (hereinafter referred to as device 100) includes: a continuously tunable laser 1, an atomic furnace 6, a chromium atomic beam 7, an optical frequency comb 10, a frequency doubling optical path 30, a bias-preserving fiber beam splitter 4, a bias-preserving fiber beam combiner 17, a beat-frequency detection optical path 40, an optoelectronic receiver 24, and a frequency counter 25.

The continuously tunable laser 1 is used to output a laser.

The atomic furnace 6 is used to eject the chromium atomic beam 7.

The optical frequency comb 10 is used to measure a frequency and length of the laser.

The frequency doubling optical path 30 refers to an optical path consisting of a plurality of optical elements (e.g., a filter, a half-wave plate, a convex lens, a frequency doubling crystal, coupler, etc.). The frequency doubling optical path is used to realize laser frequency conversion.

The bias-preserving fiber beam splitter 4 is used to evenly distribute an input signal (e.g., a laser) to a plurality of output ports. For example, as shown in FIG. 1, the bias-preserving fiber beam splitter 4 is used to evenly distribute the laser (e.g., a laser output from the continuously tunable laser 1) to a first output end ⊙-1 and a second output end ⊙-2 of the bias-preserving fiber beam splitter 4.

The bias-preserving fiber beam combiner 17 is used to receive a plurality of input signals (e.g., the laser) and combine a plurality of input signals into an output port. For example, as shown in FIG. 1, the bias-preserving fiber beam combiner 17 may receive a laser output from the frequency doubling optical path 30 and a laser emitted from the continuously tunable laser 1 and split by the bias-preserving fiber beam splitter 4 (i.e., the laser output from the first output of the bias-preserving fiber beam splitter 4), the bias-preserving fiber beam combiner 17 combines two received lasers and outputs the two lasers (e.g., the bias-preserving fiber beam combiner 17 outputs the two lasers to the second collimator 18).

The beat-frequency detection optical path 40 refers to an optical path consisting of a plurality of optical elements (e.g., a collimator, a reflector, a half-wave plate, a polarized beam splitter cube, a diffraction grating, etc.).

The optoelectronic receiver 24 is used to convert an optical signal (e.g., a laser) into an electrical signal that can be analyzed and processed.

The frequency counter 25 is used to measure a frequency of an electrical signal.

In some embodiments, one side of an output end of the continuously tunable laser 1 is provided with a first half-wave plate 2, a first coupler 3, and a bias-preserving fiber beam splitter 4 arranged in order. As shown in FIG. 1, an output end ⊙ of the continuously tunable laser 1 is connected to an input end ⊕ of the first half-wave plate 2, an output end ⊙ of the first half-wave plate 2 is connected to the an input end ⊕ of the first coupler 3, and an output end ⊙ of the first coupler 3 is connected to an input end ⊕ of the bias-preserving fiber beam splitter 4.

In some embodiments, an output end of the continuously tunable laser 1 is connected to an input end of the bias-preserving fiber beam splitter 4.

In some embodiments, an output end of the optical frequency comb 10 is connected to the frequency doubling optical path 30. As shown in FIG. 1, the output end ⊙ of the optical frequency comb 10 is connected to an input end ⊕ of the frequency doubling optical path 30.

In some embodiments, the frequency doubling optical path 30 and a first output end of the bias-preserving fiber beam splitter 4 are connected to an input end of the bias-preserving fiber beam combiner 17, respectively. As shown in FIG. 1, an output end ⊙ of the frequency doubling optical path 30 is connected to an input end ⊕ of the bias-preserving fiber beam combiner 17; and the first output end ⊙-1 of the bias-preserving fiber beam splitter 4 is connected to the input end ⊕ of the bias-preserving fiber beam combiner 17.

In some embodiments, the chromium atomic beam 7 is ejected through the atomic furnace 6 and interacts with a second output end of the bias-preserving fiber beam splitter 4. As shown in FIG. 1, the chromium atomic beam 7 is ejected through the atomic furnace 6 and interacts with a laser output from the second output end ⊙-2 of the bias-preserving fiber beam splitter 4. In some embodiments, the laser output from the second output end ⊙-2 of the bias-preserving fiber beam splitter 4 interacts with the chromium atomic beam 7 after passing through a first collimator 5.

In some embodiments, an output end of the bias-preserving fiber beam combiner 17 is connected to an input end of the beat-frequency detection optical path 40. As shown in FIG. 1, the output end ⊙ of the bias-preserving fiber beam combiner 17 is connected to the input end ⊕ of the beat-frequency detection optical path 40.

In some embodiments, an output end of the beat-frequency detection optical path 40 is connected to an input end of the frequency counter 25 through the optoelectronic receiver 24. As shown in FIG. 1, the output end ⊙ of the beat-frequency detection optical path 40 is connected to the input end ⊕ of the frequency counter 25 through the optoelectronic receiver 24. Specifically, the output end ⊙ of the beat-frequency detection optical path 40 is connected to an input end ⊕ of the optoelectronic receiver 24, and an output end ⊙ of the optoelectronic receiver 24 is connected to the input end ⊕ of the frequency counter 25.

In some embodiments, the frequency doubling optical path 30 includes a filter 11, a second half-wave plate 12, a first convex lens 13, a frequency doubling crystal PPLN 14, a second convex lens 15, and a second coupler 16.

The filter 11 is used to filter out unwanted spectral components or interfering light from the laser.

The half-wave plates (e.g., the first half-wave plate 2, the second half-wave plate 12, and the third half-wave plate 20) are used to change a polarization state of the laser.

The convex lenses (e.g., the first convex lens 13, the second convex lens 15) are used to focus the laser.

The frequency doubling crystal PPLN 14 is used to realize a frequency conversion of the laser.

In some embodiments, an output end of the optical frequency comb 10 is connected to an input end of the filter 11. As shown in FIG. 1, the output end of the optical frequency comb 10 is connected to the input end ⊕ of the filter 11. In some embodiments, the input end of the filter 11 may be used as the input end of the frequency doubling optical path 30 above.

In some embodiments, an output end of the filter 11 is connected to an input end of the second half-wave plate 12. As shown in FIG. 1, the output end ⊙ of the filter 11 is connected to the input end ⊕ of the second half-wave plate 12.

In some embodiments, an output end of the second half-wave plate 12 is connected to an input end of the frequency doubling crystal PPLN 14. As shown in FIG. 1, the output end ⊙ of the second half-wave plate 12 is connected to the input end ⊕ of the frequency doubling crystal PPLN 14.

In some embodiments, an output end ⊙ of the frequency doubling crystal PPLN 14 is connected to an input end ⊕ of the second coupler 16.

In some embodiments, the first convex lens 13 and the second convex lens 15 are provided at each of both ends of the frequency doubling crystal PPLN 14, respectively. The output end of the second half-wave plate 12 is connected to the input end of the frequency doubling crystal PPLN 14 through the first convex lens 13. The output end of the frequency doubling crystal PPLN 14 is connected to the input end of the second coupler 16 through the second convex lens 15. In some embodiments, the first convex lens 13 and the second convex lens 15 are configured to focus a beam within the frequency doubling crystal PPLN 14.

In some embodiments, an output end ⊙ of the second coupler 16 is connected to an input end of the bias-preserving fiber beam combiner 17. In some embodiments, the output end of the second coupler 16 may be regarded as the output end of the frequency doubling optical path 30 above.

In some embodiments, the beat-frequency detection optical path 40 includes a second collimator 18, a second reflector 19, a third half-wave plate 20, a polarized beam splitter cube 21, a third reflector 22, and a diffraction grating 23.

The collimators (e.g., the first collimator 5 and the second collimator 18) are used to collimate the laser.

The polarized beam splitter cube 21 is used to separate horizontal and vertical polarization of the laser.

The diffraction grating 23 is used to periodically spatially modulate the amplitude and/or phase of the laser.

In some embodiments, the second reflector 19 and the third reflector 22 are placed in parallel. As shown in FIG. 1, the surface of the second reflector 19 and the surface of the third reflector 22 are placed in parallel.

In some embodiments, the output end ⊙ of the bias-preserving fiber beam combiner 17 is connected to an input end of the optoelectronic receiver 24 after passing the second collimator 18, the second reflector 19, the third half-wave plate 20, the polarized beam splitter cube 21, the third reflector 22, and the diffraction grating 23 in sequence. As shown in FIG. 1, the output end of the bias-preserving fiber beam combiner 17 is connected to an input end ⊕ of the second collimator 18; an output end ⊙ of the second collimator 18 is connected to an input end ⊕ of the third half-wave plate 20 though the second reflector 19; and an output end ⊙ of the third half-wave plate 20 is connected to the input end ⊕ of the optoelectronic receiver 24 after passing the polarized beam splitter cube 21, the third reflector 22, and the diffraction grating 23 in sequence. In some embodiments, the input end of the second collimator 18 may be regarded as the input end of the beat-frequency detection optical path 40; and the output end ⊙ of the diffraction grating 23 may be regarded as the output of the beat-frequency detection optical path 40.

In some embodiments, the atomic furnace 6 heats chromium powder to a sublimated state under a vacuum and induces the chromium atomic beam 7 by a leakage process.

The leakage process refer to means of directional flow. The inducing the chromium atomic beam 7 by the leakage process refers to that, the chromium atomic beam 7 is controlled to release in the means of the directional flow through a leakage orifice in the atomic furnace 6 under the vacuum.

In some embodiments, the second output end ⊙-2 of the bias-preserving fiber beam splitter 4 forms the set of opposite-direction propagating lasers through the first collimator 5 via a first reflector 8, the lasers interact with collimated chromium atomic beam 7, senses the two fluorescent spots 9, and uses a coincidence of the two fluorescent spots 9 as a basis for determining that the laser frequency is equal to the transition ($^7S_3 \rightarrow ^7P_4$) frequency of the chromium (Cr) atoms. As shown in FIG. 1, the laser output from the second output end ⊙-2 of the bias-preserving fiber beam splitter 4 is incident to the first reflector 8 after passing through the first collimator 5, and the laser incident to the first reflector 8 is laser "a" (referred to as incident laser "a"). The incident laser "a" is reflected by the first reflector 8 to form a reflected laser "b". The incident laser "a" and the reflected laser "b" are the set of opposite-direction propagating lasers. The incident laser "a" interacts with the collimated chromium atomic beam 7 to sense a fluorescent spot (noted as a first fluorescent spot); and the reflected laser "b" interacts with the collimated chromium atomic beam 7 to sense another fluorescent spot (denoted as a second fluorescent spot). When the first fluorescent spot and the second fluorescent spot coincide (the coincidence position is the position of the fluorescent spot 9 shown in FIG. 1), may determine that the laser frequency is equal to the transition ($^7S_3$-$^7P_4$) frequency of the chromium (Cr) atoms.

In some embodiments, an output wavelength band of the continuously tunable laser 1 covers 425.5±1.0 nm. In some embodiments, a frequency tuning module is provided at an input end ⊕ of the continuously tunable laser 1.

In some embodiments, a reference source of the optical frequency comb 10 is a high-stability time-frequency signal, and an output wavelength band of the optical frequency comb 10 covers 851±2 nm, and an output wavelength band covers 425.5±1.0 nm after passing through the frequency doubling crystal PPLN 14 of the frequency doubling optical path 30. The output wavelength band of the optical frequency comb 10 refers to the band of the laser output from the optical frequency comb 10. The output wavelength band of the laser output from the optical frequency comb 10 covers 851±2 nm. The laser output from the optical frequency comb 10 passes through the frequency doubling crystal PPLN 14 of the frequency doubling optical path 30 to obtain a frequency doubling laser, and the wavelength band of the frequency doubling laser covers 425.5±1.0 nm.

In some embodiments, a leakage temperature range of the chromium atomic beam 7 ejected from the atomic furnace 6 is in a range of 1500-1750 degrees Celsius. In some embodiments, the leakage temperature range of the chromium atomic beam 7 ejected from the atomic furnace 6 is in a range of 1600-1650 degrees Celsius.

In some embodiments, the atomic furnace 6 may achieve a collimation of the chromium atomic beam 7. In some embodiments, the atomic furnace 6 achieves a collimation of the chromium atomic beam 7 by a slit or a transverse laser light field.

In some embodiments, a direction of propagation of the chromium atomic beam 7 is perpendicular to a direction of propagation of the set of opposite-direction propagating lasers (the incident laser "a" and the reflected laser "b") formed at the second output end of the bias-preserving fiber beam splitter 4 through the first reflector 8.

In some embodiments, a low-pass filter is provided between the optoelectronic receiver 24 and the frequency counter 25.

FIG. 2 is an exemplary flowchart of a method of a 425 nm wavelength reference construction based on fluorescence-induced effect according to some embodiments of the present disclosure.

Referring to FIG. 2, embodiments of the present disclosure also provide a method 200 of a 425 nm wavelength reference construction based on fluorescence-induced effect (referred to as a process 200). The process 200 is performed by the device 100 above. The 425 nm wavelength reference construction based on the fluorescence-induced effect is realized based on the device 100 by the process 200. In some embodiments, the process 200 includes following steps.

S1, constructing a frequency measurement system of a laser and an optical frequency comb based on a technique of heterodyne beat frequency detection.

The heterodyne beat frequency refers to a technique that uses two signals with similar frequencies to interfere, so as to obtain a frequency difference between the two signals.

S2, setting a temperature of the atomic furnace to a state of leakage generation of the chromium atomic beam, initially adjusting a laser wavelength near a theoretical value of a transition ($^7S_3$-$^7P_4$) frequency of the chromium atoms, and a set of opposite-direction propagating lasers interacting with the chromium atomic beam and symmetrically sensitizing two fluorescent spots on both sides of a central axis of the chromium atomic beam.

The transition frequency refers to a frequency of an electromagnetic wave absorbed or emitted by a molecule or an atom when the molecule or the atom transitions between different energy levels. In some embodiments, the theoretical value of a transition ($^7S_3$-$^7P_4$) frequency of the chromium atoms is about $7.049 \times 10^4$ Hz.

The central axis of the chromium atomic beam refers to the central axis of the chromium atomic beam along the direction of propagation.

S3, finely adjusting the laser wavelength so that the two fluorescent spots symmetrically sensitized on both sides of the central axis of the chromium atomic beam, at which time a laser frequency is equal to the transition ($^7S_3$-$^7P_4$) frequency of the chromium atoms, and performing a measurement of the transition ($^7S_3$-$^7P_4$) frequency of the chromium atoms.

In some embodiments, the output wavelength of the continuously tunable laser 1 is adjusted to be near the theoretical value of the transition ($^7S_3$-$^7P_4$) frequency of the chromium atoms, and the temperature of the atomic furnace 6 is set at 1600 degrees Celsius. The atomic furnace 6 heats chromium powder to a sublimated state under a vacuum and induces the chromium atomic beam 7 by a leakage process. At the same time, a laser output from the continuously tunable laser 1 forms the set of opposite-direction propagating lasers, the opposite-direction propagating lasers interact with collimated chromium atomic beam 7, sense the two fluorescent spots 9. The laser wavelength is finely adjusted so that the two fluorescent spots 9 symmetrically sensitized on both sides of the central axis of the chromium atomic beam 7, at which time a laser frequency is equal to the transition ($^7S_3$-$^7P_4$) frequency of the chromium atoms, and a measurement of the transition ($^7S_3$-$^7P_4$) frequency of the chromium atoms is performed. In the frequency measurement system, another laser output from the continuously tunable laser 1 is combined with the optical frequency comb 10 after frequency doubling via the bias-preserving fiber beam combiner 17 produce a beat frequency signal with a signal-to-noise ratio greater than 30 dB. The beat frequency signal is input to the frequency counter 25, thereby enabling wavelength measurement of the 425.5 nm of the continuously tunable laser 1. The process 200 provided by embodiments of the present disclosure fills a gap in wavelength benchmarking in the blue-violet band.

It should be noted that the foregoing description of the process 200 is provided for the purpose of exemplification and illustration only and does not limit the scope of application of the present specification. For a person skilled in the art, various corrections and changes can be made to the method 200 under the guidance of this specification. However, these corrections and changes remain within the scope of this specification.

Figure 3:
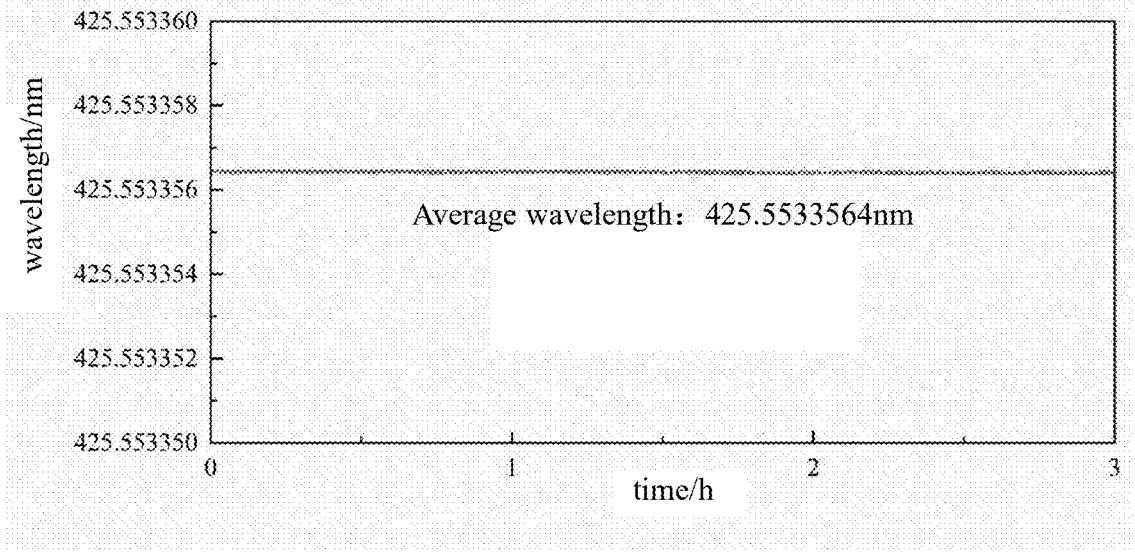
FIG. 3 is a schematic diagram of a result of a measurement of a transition frequency using an optical frequency comb of a method of a 425 nm wavelength reference construction based on fluorescence-induced effect according to some embodiments of the present disclosure.

FIG. 3 is a schematic diagram of a result of a measurement of a transition frequency using an optical frequency comb of a method of a 425 nm wavelength reference construction based on fluorescence-induced effect according to some embodiments of the present disclosure.

As shown in FIG. 3, the diagram of the result of a measurement of a transition frequency using an optical frequency comb shows that the frequency measurement method provided by the embodiments of the present disclosure allows for an accurate measurement of the transition ($^7S_3$-$^7P_4$) frequency of the chromium atoms.

The basic concepts have been described above, and it is apparent to those skilled in the art that the foregoing detailed disclosure serves only as an example and does not constitute a limitation of the present disclosure. While not expressly stated herein, various modifications, improvements, and amendments may be made to this specification by those skilled in the art. Those types of modifications, improvements, and amendments are suggested in the present disclosure, so those types of modifications, improvements, and amendments remain within the spirit and scope of the exemplary embodiments of the present disclosure.

Also, the present disclosure uses specific words to describe embodiments of the present disclosure, such as "an embodiment," "one embodiment," and/or "some embodiments" means a feature, structure, or characteristic associated with at least one embodiment of the present disclosure. Accordingly, it should be emphasized and noted that "one embodiment" or "an embodiment" or "an alternative embodiment" in different places in the present disclosure do not necessarily refer to the same embodiment. In addition, certain features, structures, or characteristics in one or more embodiments of the present disclosure may be suitably combined.

Additionally, unless expressly stated in the claims, the order of the processing elements and sequences, the use of numerical letters, or the use of other names as described in the present disclosure are not intended to qualify the order of the processes and methods of the present disclosure. While some embodiments of the invention that are currently considered useful are discussed in the foregoing disclosure by way of various examples, it should be appreciated that such details serve only illustrative purposes, and that additional claims are not limited to the disclosed embodiments, rather, the claims are intended to cover all amendments and equivalent combinations that are consistent with the substance and scope of the embodiments of the present disclosure. For example, although the implementation of various components described above may be embodied in a hardware device, it may also be implemented as a software only solution, e.g., an installation on an existing server or mobile device.

Similarly, it should be noted that in order to simplify the presentation of the present disclosure, and thereby aid in the understanding of one or more embodiments of the invention, the foregoing descriptions of embodiments of the present disclosure sometimes group multiple features together in a single embodiment, accompanying drawings, or a description thereof. However, this method of disclosure does not imply that the objects of the present disclosure require more features than those mentioned in the claims. Rather, claimed subject matter may lie in less than all features of a single foregoing disclosed embodiment.

Some embodiments use numbers to describe the number of components, attributes, and it should be understood that such numbers used in the description of embodiments are modified in some examples by the modifiers "approximately," "nearly," or "substantially". Unless otherwise noted, the terms "approximately," "nearly," or "substantially" indicates that a ±20% variation in the stated number is allowed. Correspondingly, in some embodiments, the numerical parameters used in the present disclosure and claims are approximations, which can change depending on the desired characteristics of individual embodiments. In some embodiments, the numerical parameters should take into account the specified number of valid digits and employ general place-keeping. While the numerical domains and parameters used to confirm the breadth of their ranges in some embodiments of the present disclosure are approximations, in specific embodiments, such values are set to be as precise as possible within a feasible range.

For each patent, patent application, patent application disclosure, and other material cited in the present disclosure, such as articles, books, manuals, publications, documents, etc., the entire contents of which are hereby incorporated by reference into the present disclosure Application history documents that are inconsistent with or conflict with the contents of the present disclosure are excluded, as are documents (currently or hereafter appended to the present disclosure) that limit the broadest scope of the claims of the present disclosure. It should be noted that in the event of any inconsistency or conflict between the descriptions, definitions, and/or use of terms in the materials appended to the present disclosure and those set forth herein, the descriptions, definitions and/or use of terms in this specification shall prevail.

Finally, it should be understood that the embodiments described in the present disclosure are only used to illustrate the principles of the embodiments of the present disclosure. Other deformations may also fall within the scope of the present disclosure. As such, alternative configurations of embodiments of the present disclosure may be viewed as consistent with the teachings of the present specification as an example, not as a limitation. Correspondingly, the embodiments of the present disclosure are not limited to the embodiments expressly presented and described herein.

What is claimed is:

1. A device of a 425 nm wavelength reference construction based on fluorescence-induced effect, comprises: a continuously tunable laser, an atomic furnace, a chromium atomic beam, an optical frequency comb, a frequency doubling optical path, a bias-preserving fiber beam splitter, a bias-preserving fiber beam combiner, a beat-frequency detection optical path, an optoelectronic receiver, and a frequency counter; wherein an output end of the continuously tunable laser is provided with a first half-wave plate, a first coupler, and the bias-preserving fiber beam splitter arranged in order;

the output end of the continuously tunable laser is connected to an input end of the bias-preserving fiber beam splitter;

an output end of the optical frequency comb is connected to the frequency doubling optical path;

the frequency doubling optical path and a first output end of the bias-preserving fiber beam splitter are connected to an input end of the bias-preserving fiber beam combiner, respectively;

the chromium atomic beam is emitted through the atomic furnace and interacts with a second output end of the bias-preserving fiber beam splitter;

an output end of the bias-preserving fiber beam combiner is connected to an input end of the beat-frequency detection optical path;

an output end of the beat-frequency detection optical path is connected to an input end of the frequency counter through the optoelectronic receiver;

the beat-frequency detection optical path includes a second collimator, a second reflector, a third half-wave plate, a polarized beam splitter cube, a third reflector, and a diffraction grating;

wherein the second reflector and the third reflector are placed in parallel;

the output end of the bias-preserving fiber beam combiner is connected to an input end of the optoelectronic receiver after passing the second collimator, the second reflector, the third half-wave plate, the polarized beam splitter cube, the third reflector, and the diffraction grating in sequence;

the 425 nm wavelength reference construction is realized based on the device by a method for constructing a 425 nm wavelength reference based on the sensible fluorescence effect, the method comprising:

S1, constructing a frequency measurement system of a laser and the optical frequency comb based on a technique of heterodyne beat frequency detection;

S2, setting a temperature of the atomic furnace to a state of leakage generation of the chromium atomic beam, initially adjusting a laser wavelength near a theoretical value of a transition ($^7S_3$-$^7P_4$) frequency of the chromium atoms, and a set of opposite-direction propagating lasers interacting with the chromium atomic beam and symmetrically sensitizing two fluorescent spots on both sides of a central axis of the chromium atomic beam; and S3, finely adjusting the laser wavelength so that the two fluorescent spots symmetrically sensitized on both sides of the central axis of the chromium atomic beam, at which time a laser frequency is equal to the transition ($^7S_3$-$^7P_4$) frequency of the chromium atoms, and performing a measurement of the transition ($^7S_3$-$^7P_4$) frequency of the chromium atoms.

2. The device according to claim 1, wherein the frequency doubling optical path includes a filter, a second half-wave plate, a first convex lens, a frequency doubling crystal PPLN, a second convex lens, and a second coupler;

the output end of the optical frequency comb is connected to an input end of the filter;

an output end of the filter is connected to an input end of the second half-wave plate;

an output end of the second half-wave plate is connected to an input end of the frequency doubling crystal PPLN;

a first convex lens and a second convex lens are provided at each end of the frequency doubling crystal PPLN, respectively, the first convex lens and the second convex lens are configured to focus a beam within the frequency doubling crystal PPLN.

3. The device according to claim 2, wherein an output wavelength band of the continuously tunable laser covers 425.5±1.0 nm, and a frequency tuning module is provided at an input end of the continuously tunable laser;

a reference source of the optical frequency comb is a high-stability time-frequency signal, and an output wavelength band of the optical frequency comb covers 851±2 nm, and an output wavelength band covers 425.5±1.0 nm after passing through the frequency doubling crystal PPLN of the frequency doubling optical path.

4. The device according to claim 1, wherein the atomic furnace heats chromium powder to a sublimated state under a vacuum and inducing the chromium atomic beam by a drain means;

the second output end of the bias-preserving fiber beam splitter forms the set of opposite-direction propagating lasers through a first collimator via a first reflector, the lasers interact with collimated chromium atomic beam, sensing the two fluorescent spots, and using a coincidence of the two fluorescent spots as a basis for determining that the laser frequency is equal to the transition $(^7S_3 \text{-} ^7P_4)$ frequency of the chromium (Cr) atoms.

5. The device according to claim 4, wherein a direction of propagation of the chromium atomic beam is perpendicular to a direction of propagation of the set of opposite-direction propagating lasers formed at the second output end of the bias-preserving fiber beam splitter through the first reflector.

6. The device according to claim 1, wherein an effusion temperature of the chromium atomic beam emitted from the atomic furnace is in a range of 1500-1750 degrees Celsius.

7. The device according to claim 1, wherein the atomic furnace achieves a collimation of the chromium atomic beam by a slit or a transverse laser light field.

8. The device according to claim 1, wherein a low-pass filter is provided between the optoelectronic receiver and the frequency counter.

* * * * *